(12) United States Patent
Marten

(10) Patent No.: US 6,486,871 B1
(45) Date of Patent: Nov. 26, 2002

(54) POINTING DEVICE WITH Z-AXIS FUNCTIONALITY AND REDUCED COMPONENT COUNT

(75) Inventor: Victor Marten, Flushing, NY (US)

(73) Assignee: Semtech Corporation, Carmarillo, CA (US)

( * ) Notice: Subject to any disclaimer, the term of this patent is extended or adjusted under 35 U.S.C. 154(b) by 0 days.

(21) Appl. No.: 09/958,501

(22) PCT Filed: Jan. 24, 2001

(86) PCT No.: PCT/US01/02389

§ 371 (c)(1),
(2), (4) Date: Mar. 12, 2002

(87) PCT Pub. No.: WO01/56008

PCT Pub. Date: Aug. 2, 2001

Related U.S. Application Data

(60) Continuation-in-part of application No. 09/764,222, filed on Jan. 16, 2001, which is a continuation of application No. 09/157,739, filed on Sep. 21, 1998, now Pat. No. 6,175,359, which is a division of application No. 08/708,048, filed on Aug. 30, 1996, now Pat. No. 5,874,938.
(60) Provisional application No. 60/178,887, filed on Jan. 28, 2000.

(51) Int. Cl.[7] .................................................. G09G 5/08
(52) U.S. Cl. ........................ 345/157; 345/161; 345/174
(58) Field of Search ................................. 345/161, 156, 345/157, 160, 168, 173, 174, 179; 74/471 XY; 341/22; 178/18.01, 18.05

(56) References Cited

U.S. PATENT DOCUMENTS

| 5,489,900 A | 2/1996 | Cali et al. |
|---|---|---|
| 5,680,154 A | 10/1997 | Shiga et al. |
| 5,696,535 A | 12/1997 | Rutledge et al. |
| 5,874,938 A | 2/1999 | Marten |
| 6,121,954 A | 9/2000 | Seffernick |
| 6,175,359 B1 | 1/2001 | Marten |
| 6,243,077 B1 * | 6/2001 | Manara et al. ............. 345/157 |

* cited by examiner

Primary Examiner—Dennis-Doon Chow
(74) Attorney, Agent, or Firm—Oppendahl & Larson LLP

(57) ABSTRACT

Apparatus and method are disclosed for receiving human input by means of a pointing device, typically a strain gauge. Three dimensions of input are received from a resistor bridge by means of four contact points to the strain gauge. A sequence of excitation signals is applied to the bridge and a multiplexer is employed to permit a signal processor to sample sensor outputs. The apparatus processes the sampled outputs and determines the user inputs such as X and Y and Z values of the pointing device.

4 Claims, 2 Drawing Sheets

POINTING DEVICE WITH Z-AXIS FUNCTIONALITY AND REDUCED COMPONENT COUNT

This application claims priority from U.S. appl. Ser. No. 60/178,887, filed Jan. 28, 2000, which application is incorporated herein by reference. In addition, This is a continuation-in-part of U.S. appl. Ser. No. 09/764,222, filed Jan. 16, 2001, which is a continuation of U.S. appl. Ser. No. 09/157,739, filed Sep. 21, 1998, now U.S. Pat. No. 6,175,359, issued Jan. 16, 2001, which is a divisional of U.S. appl. Ser. No. 08/708,048, filed Aug. 30, 1996, now U.S. Pat. No. 5,874,938, issued Feb. 23, 1999, all of which are incorporated herein by reference.

The invention relates generally to pointing devices and relates more particularly to pointing devices having Z-axis functionality.

BACKGROUND

With the widespread adoption of graphical user interfaces, it has become very important to provide pointing devices so that users can provide inputs that cause motion of a cursor on a screen. While mice and other rodents are in common use, many users now prefer stick pointers and touch pads, typically integrated into a computer. The typical stick pointer is a button located in the middle of the keyboard, connected mechanically to a strain gauge. Circuitry detects signals developed in the strain gauge to derive X and Y information regarding lateral force applied to the gauge by the user through the button.

The typical strain gauge is essentially a resistor bridge, the resistances of which are affected by forces in the bulk material of the gauge. Assuming that cost, power consumption and physical bulk are no object, then it is a straightforward matter to provide excitation signals to nodes of the bridge and to detect voltages at other nodes of the bridge. The detected voltages can be provided to one or more analog-to-digital convertors of arbitrarily high speed, accuracy and precision for further processing.

A stick pointer sensor is conveniently connected to its electronics by means of a flexible sensor cable, which offers the great advantage that the sensor and the electronics do not need to be close to each other. Such a cable is, however, a significant contributing source of noise and drift in the system, due to its relatively great length (several inches) and, therefore, the ability to pick up noise and RFI (radio frequency interference) from nearby circuitry and from other sources such as cellular telephones.

For the designer of circuitry attached to the gauge, however, there are many competing design goals. It is desired to minimize component count outside of any integrated circuits, to minimize assembly cost. It is desired to have immunity to any of a number of sources of noise and drift. In recent years, as computers have become smaller and lighter in weight, it is important to make the circuitry small and light in weight. The trend toward smaller and lighter computers also prompts the computer designer to minimize battery size and weight, thus forcing the pointing device circuitry designer to try to minimize power consumption. Despite all of these constraints it is also desired that the pointing device be very accurate. Approaches for such pointing devices may be seen in U.S. Pat. No. 6,175,359, issued Jan. 16, 2001, and U.S. Pat. No. 5,874,938, incorporated herein by reference.

These constraints and goals make the design of the pointing device system very challenging. One skilled in the art may then appreciate that yet another design goal has presented itself in recent years—allowing the stick pointer to perform not only as a pointer (provider of X-Y data) but also as a left mouse button (provider of Z data). When this design goal is added to the many goals and constraints discussed above, the design task is extremely challenging.

It is desirable, then, to provide a pointing device having reduced component count, Z-axis functionality, with acceptable noise rejection and signal-to-noise ratio, programmable gain, and high isolation from power supply noise.

SUMMARY OF THE INVENTION

Apparatus and method are disclosed for receiving human input by means of a pointing device, typically a strain gauge. Three dimensions of input are received from a resistor bridge by means of four contact points to the strain gauge. A sequence of excitation signals is applied to the bridge and a multiplexer is employed to permit a signal processor to sample sensor outputs. The apparatus processes the sampled outputs and determines the user inputs such as X and Y and Z values of the pointing device.

DESCRIPTION OF THE DRAWING

The invention will be described with respect to a drawing in several figures, of which.

DETAILED DESCRIPTION

Figure 3:
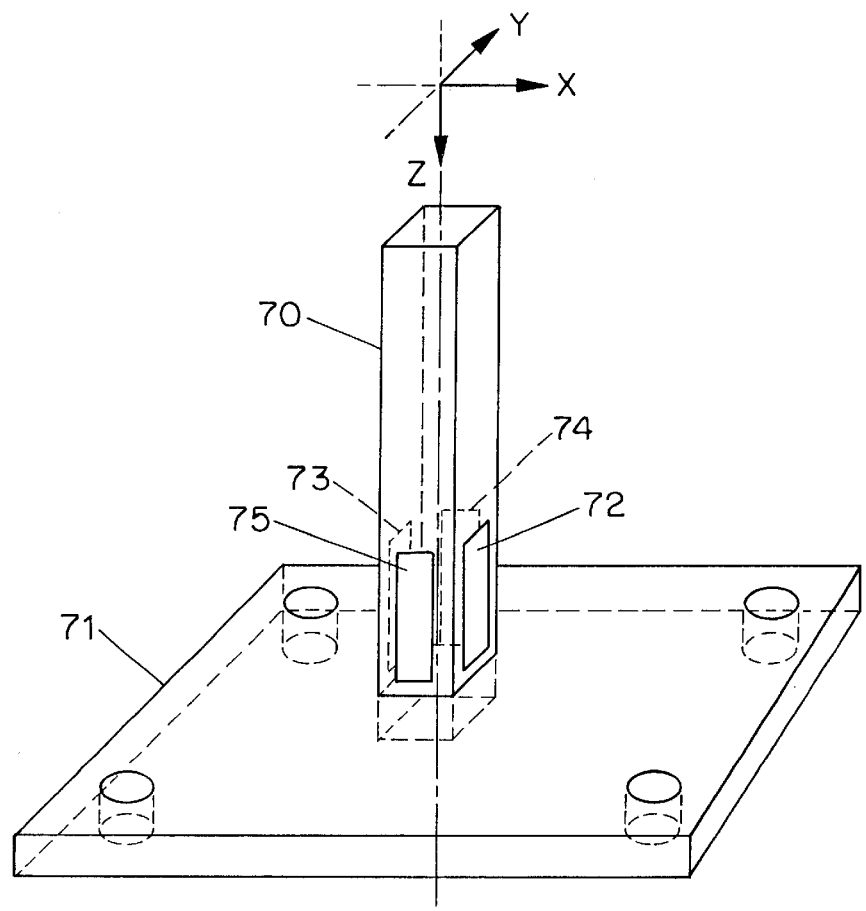
FIG. 3 defines geometry relationships for a pointing device according to the invention.

Turning first to FIG. 3, what is shown is a simplified mechanical view of a stick pointer defining geometry relationships for a pointing device. A firm but flexible beam or post 70 has square cross section, with four piezo-resistive strain gauge elements 72, 73, 74, 75 mounted to respective sides of the beam near its mounting to baseplate 71. The long axis of the post defines coordinates. Force perpendicular to the long axis gives rise to deflection of the post in the X and/or Y directions. Downward axial force, on the other hand, is defined as Z force. It is desirable to position the piezoresistive elements at a point of maximum deformation and thus largest mechanical strain, when force is applied, which maximizes the electrical output from the sensing elements.

The response of the piezoresistive elements to strains is well known to those in the art. Deflection in the positive X direction in FIG. 3 (to the right) will give rise to a decreased resistance in element 72 (resistance 2 in FIG. 1) and an increased resistance in element 73 (resistance 3 in FIG. 1). The other two elements will have little or no change in resistance.

Figure 1:
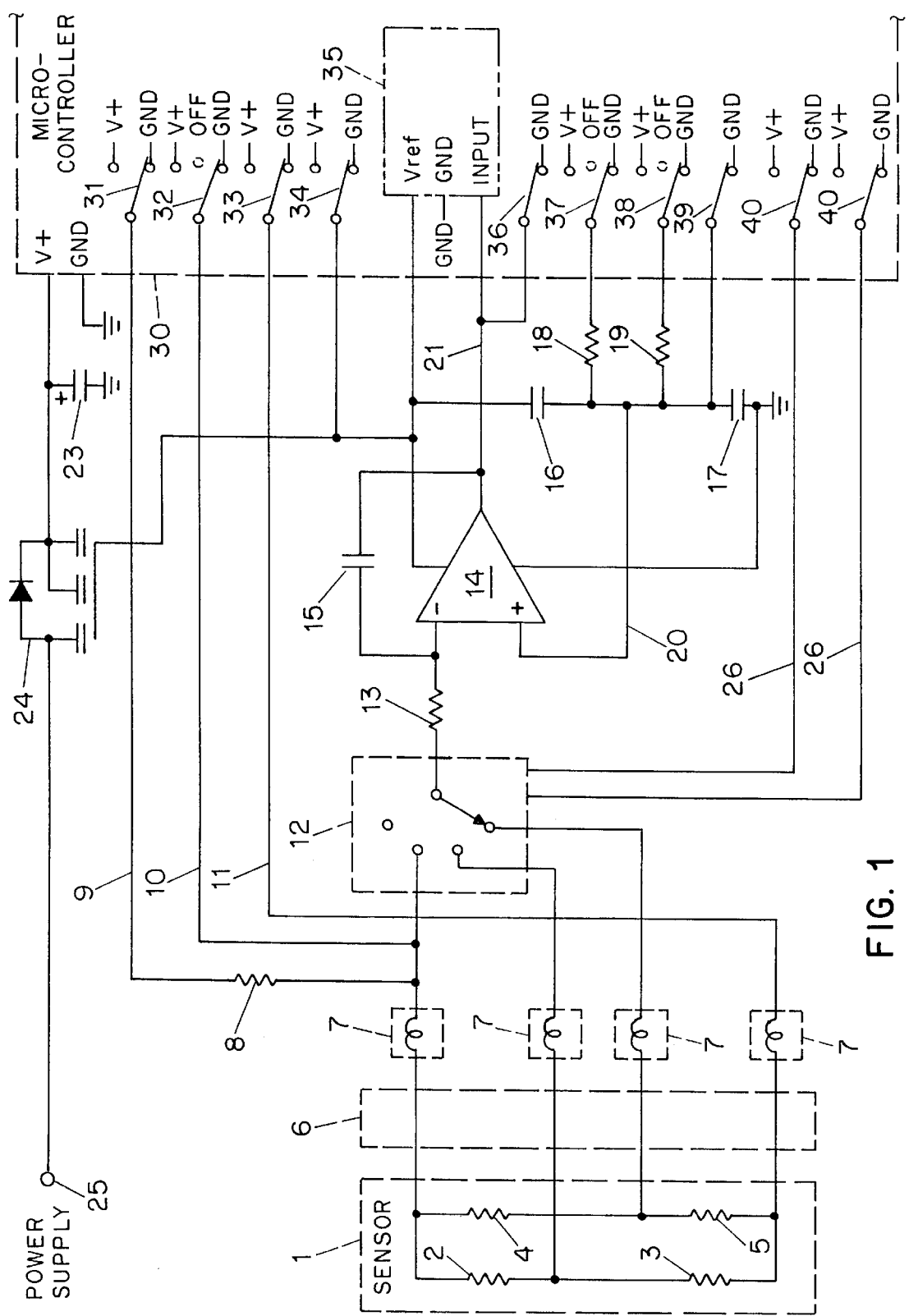
FIG. 1 is a schematic diagram of apparatus which is an embodiment of the invention.

Deflection in the positive Y direction in FIG. 3 (into the page) will give rise to a decreased resistance in element 74 (resistance 4 in FIG. 1) and an increased resistance in element 75 (resistance 5 in FIG. 1). The other two elements will have little or no change in resistance.

Deflection in the Z direction (downwards in FIG. 3) will give rise to decreased resistance in all four piezoelectric sensors.

Turning now to FIG. 1, what is shown is a schematic diagram of apparatus which is an embodiment of the invention. Sensor 1 is a resistor bridge, typically part of a strain gauge. It contains four resistorances 2, 3, 4, 5 which define four nodes which are points of external connection via sensor cable 6. Ferrite beads 7 are preferably provided for RFI protection. A four-input multiplexer 12, controlled by control lines 26, selects one of four inputs for op amp (operational amplifier) 14.

Figure 2:
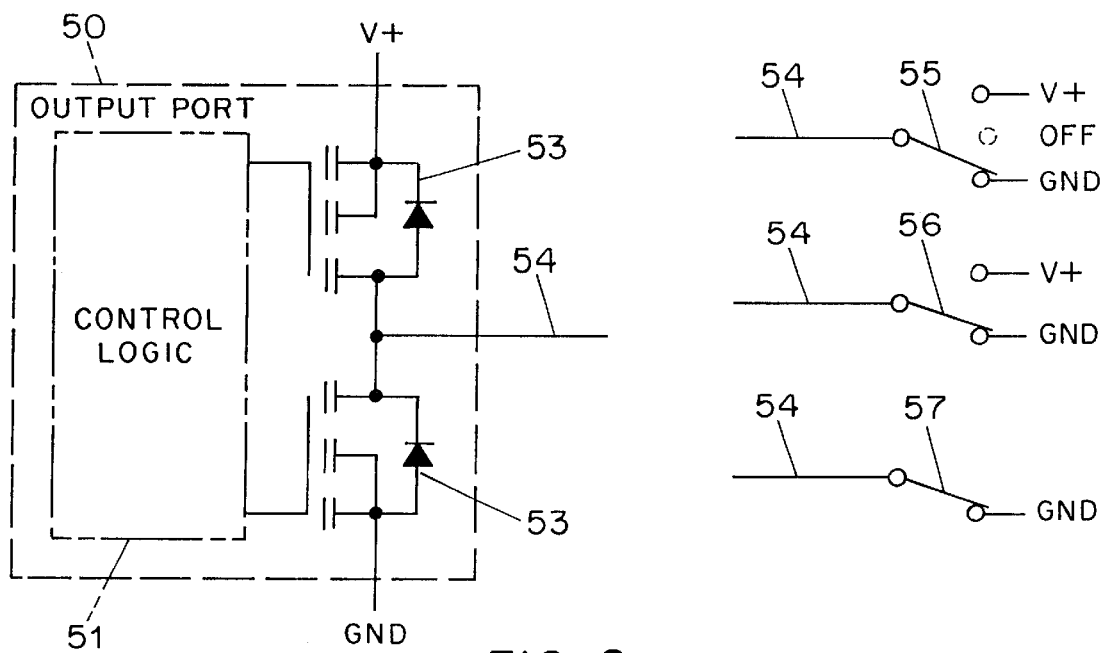
FIG. 2 shows a typical tri-state line driver of a type usable in the system of FIG. 1.

Circuitry 30, preferably a general-purpose microcontroller, has discrete output switches 31, 32, 33, 34, 36, 37, 38, 39, 40. Each of these switches is digitally controlled. Turning briefly to FIG. 2, an output port 50 comprises typical control components 52, 53, preferably field-effect transistors. Control logic 51 ensures that FETs 52, 53 are never conducting simultaneously since such conduction would cause component failure. If FET 52 is turned on, then the output pin 54 is at V+ potential (less the voltage drop of the FET). If FET 53 is turned on, then the output pin 54 is at ground potential If neither FET is turned on, then the output is at high impedance. This provides a classic tri-state driver. In this way an output port of the microcontroller may serve as an SPST switch 57, an SPDT switch 56, or as a tristate switch 55.

Returning to FIG. 1, we see that discrete output switches 36 and 39 serve as SPST switches to ground, discrete output switches 31, 33, 34 and 40 each serve as SPDT switches, and discrete output switches 32, 37 and 38 each serve as tristate drivers.

In this exemplary embodiment it is assumed that microcontroller 30 comprises a built-in A/D (analog-to-digital) convertor 35.

For X or Y sensing, the excitation voltage is applied to the sensor via XY drive line 11 and Z sense line 10. For Z sensing, the excitation voltage is applied to the sensor via XY drive line 11 and Z drive line 9; during such sensing Z sense driver 32 is floating.

According to the invention, two measurements are made for each axis. A first measurement is made with "forward" excitation, for example the XY drive line 11 is pulled at or close to ground potential. A second measurement is made with "reverse" excitation, for example the XY drive line 11 is pulled at or close to V+ potential. There are thus a total of six measurements—two for X, two for Y, and two for Z.

Sensing elements form half of a Wheatstone bridge. The other half of the bridge is from the D/A convertor defined by capacitors 16, 17, resistors 18, 19, and microcontroller pins 34, 37, 38 and 39. In order to develop an appropriate voltage on the offset line 20, the drivers 34, 37, 38, and 39 are toggled, switched, or floated as required. The driver settings are made with different timing and thus offset voltages for each of the six measurements.

Op amp 14 and integrating capacitor 15 integrate the current input (not the voltage input) for a controlled interval of time. Resistor 13 may be used for fine compensation of the sensors 1 of different makes and offers some protection to the input of the op amp. Resistor 13 is preferably small compared with the resistances of the sensor 1.

As is well known to those skilled in the art, a system designer may choose any of various integration intervals for such an integrator. Increasing the integration time also increases the signal-to-noise ratio.

Also importantly, each of the three orthogonal measurements is performed twice, once in each of two polarities. This permits detecting and correcting for leakage.

After some interval during which the op amp 14 has been integrating (through the second, third, or fourth inputs of multiplexer 12) then the multiplexer may be switched to the first position. The integrator becomes a "hold" circuit, having previously measured a sample.

This provides a constant input to the A/D convertor 35. It is preferable to arrange the signal levels and gains so that the signal 21 is smaller than the full-scale input range of A/D convertor. In an exemplary embodiment, the signal 21 is for example one-fourth of the full-scale input range of the A/D convertor. The total dynamic range for the circuit, measured in bits, is the width of the D/A convertor, plus the width of the A/D convertor, less two.

In this way the dynamic range of the system can easily approach 20 bits with a commonly available 10-bit A/D convertor and a 12-bit D/A convertor. The A/D convertor, then, can be of relatively low resolution, so long as the D/A convertor is of higher resolution.

After one measurement has been made, it is repeated with the reversed excitation voltage. The two results are subtracted from each other in software, and this cancels out most of the leakage, input-current, and some temperature-induced errors. It is convenient to give software the task of removing some small residual offsets.

It is also helpful to add the two measurements. When this is done, the sum is used for correction of the voltages on the offset line 20, for both measurements during the next sampling cycle. Correction of the offset voltages is necessary due to slow but unpredictable temperature-induced variations of component values, microcontroller port leakage, and op amp offset and/or bias current.

From experience it is apparent that it is advantageous to use a longer integration time for the Z measurements as compared with the integration time used for the X and Y measurements. This provides a virtual gain for the Z measurements.

It will be appreciated that the circuit is insensitive to any long-term variations in the power supply, but is sensitive to short-term noise and short-term variations in the power supply.

Interference from power supply noise is reduced by P-channel MOS transistor 24. When the circuit begins one of its six measurement cycles, the line 22 is ramped from ground to V+, thereby providing zero enhancement voltage on the gate of the p MOSFET. This effectively disconnects the whole circuit (except the microcontroller) from the power supply.

During stick point strain measurements, all of the power comes from the bypass and storage capacitor 23. This capacitor 23 may be 47 uF. Capacitor 23 is should be large enough that the voltage drop during measurement is less than one diode drop.

Startup of the system is assured by the body diode of the MOSFET 24.

Stated differently, it may be said that what is disclosed is a resistor bridge sensor 1 having first, second, third, and fourth resistances 2, 3, 4, 5, said first resistance 2 connected between first and second terminals, said second resistance 3 connected between said second terminal and a third terminal, said third resistance 4 connected between said third terminal and a fourth terminal, and said fourth resistance 5 connected between said fourth and first terminals. In this apparatus, a first switch 31 connects the first terminal of the sensor through a resistor 8 selectively to a first potential or to a second potential. A second switch connects the first terminal of the sensor selectively to a first potential, to a second potential, or to an open connection A third switch connects the third terminal of the sensor selectively to a first potential or to a second potential; a multiplexer having first, second, third, and fourth terminals, said multiplexer selectively connecting one of said first, second, and third terminals of the multiplexer to the fourth terminal of the multiplexer; said first terminal of said multiplexer 12 connected to said first terminal of said sensor; said second terminal of said multiplexer connected to said fourth terminal of said sensor; said thud terminal of said multiplexer connected to said second terminal of said sensor.

In such a system, it is advantageous to provide an integrator 14, 15 receiving an input from the fourth terminal of the multiplexer and providing an output to an analog-to-digital convertor 35.

The method steps to be followed may be described as follows: connecting a first terminal of the sensor to a first potential and connecting a third terminal to a second potential, and measuring the potential at the second terminal, and connecting the first terminal to the second potential and connecting the third terminal to the first potential, and measuring the potential at the second terminal, and calculating a difference between the potentials. This gives rise to, say, an X measurement.

A next step is connecting the first terminal to a first potential and connecting the third terminal to a second potential, and measuring the potential at the fourth terminal, and connecting the first terminal to the second potential and connecting the third terminal to the first potential, and measuring the potential at the fourth terminal, and calculating a difference between the potentials. This gives rise to, say, a Y measurement.

A next step is connecting the first terminal through a resistor to a first potential and connecting the third terminal to a second potential, and measuring the potential at the first terminal, and connecting the first terminal through the resistor to the second potential and connecting the third terminal to the first potential, and measuring the potential at the first terminal, and calculating a difference between the potentials. This gives rise to a Z measurement.

While the invention is described with respect to particular structures and steps, it will be appreciated that many changes to the structures and steps could be made without departing in any way from the invention. Such changes include employing a positive ground instead of a negative ground, locating the analog-to-digital convertor outside the microcontroller instead of within it, and rearranging circuit components so that the layout is different while maintaining the same function. Likewise the values of particular components could be adjusted to accommodate particular conditions.

Those skilled in the art will readily develop obvious changes and enhancements to the invention, all of which are intended to be covered by the claims which follow.

I claim:

1. Apparatus comprising:
   a resistor bridge sensor having first, second, third, and fourth resistances, said first resistance connected between first and second terminals, said second resistance connected between said second terminal and a third terminal, said third resistance connected between said third terminal and a fourth terminal, said fourth resistance connected between said fourth and first terminals;

a first switch connecting the first terminal of the sensor through a resistor selectively to a first potential or to a second potential;

a second switch connecting the first terminal of the sensor selectively to a first potential, to a second potential, or to an open connection;

a third switch connecting the third terminal of the sensor selectively to a first potential or to a second potential;

a multiplexer having first, second, third, and fourth terminals, said multiplexer selectively connecting one of said first, second, and third terminals of the multiplexer to the fourth terminal of the multiplexer;

said first terminal of said multiplexer connected to said first terminal of said sensor;

said second terminal of said multiplexer connected to said fourth terminal of said sensor;

said third terminal of said multiplexer connected to said second terminal of said sensor.

2. The apparatus of claim 1 further comprising an integrator receiving an input from the fourth terminal of the multiplexer and providing an output to an analog-to-digital convertor.

3. A method for use with apparatus comprising a resistor bridge sensor having first, second, third, and fourth resistances, said first resistance connected between first and second terminals, said second resistance connected between said second terminal and a third terminal, said third resistance connected between said third terminal and a fourth terminal, said fourth resistance connected between said fourth and first terminals; said method comprising the steps of:

connecting said first terminal to a first potential and connecting said third terminal to a second potential, and measuring the potential at the second terminal, and connecting said first terminal to the second potential and connecting said third terminal to the first potential, and measuring the potential at the second terminal, and calculating a difference between the potentials;

connecting said first terminal to a first potential and connecting said third terminal to a second potential, and measuring the potential at the fourth terminal, and connecting said first terminal to the second potential and connecting said third terminal to the first potential, and measuring the potential at the fourth terminal, and calculating a difference between the potentials;

connecting said first terminal through a resistor to a first potential and connecting said third terminal to a second potential, and measuring the potential at the first terminal, and connecting said first terminal through the resistor to the second potential and connecting said third terminal to the first potential, and measuring the potential at the first terminal, and calculating a difference between the potentials.

4. The method of claim 3 wherein each measurement of potential is performed by integrating current over a controlled interval and providing the result of the integration to an analog-to-digital convertor.

* * * * *

UNITED STATES PATENT AND TRADEMARK OFFICE
CERTIFICATE OF CORRECTION

PATENT NO.     : 6,486,871 B1
DATED          : November 26, 2002
INVENTOR(S)    : Victor Marten It is certified that error appears in the above-identified patent and that said Letters Patent is hereby corrected as shown below:

<u>Title page,</u>
Item [73], Assignee, "Carmarillo" should read -- Camarillo --.
Item [74], "Oppendahl" should read -- Oppedahl --.

<u>Column 4,</u>
Lines 4 and 8, the portion of the sentence reading "AID" should read -- A/D --.

<u>Column 5,</u>
Line 9, the portion of the sentence reading "thud" should read -- third --.

Signed and Sealed this

Eighth Day of June, 2004

JON W. DUDAS
*Acting Director of the United States Patent and Trademark Office*